US006665170B1

(12) United States Patent
Warner et al.

(10) Patent No.: US 6,665,170 B1
(45) Date of Patent: Dec. 16, 2003

(54) LIGHT EMITTING DIODE ILLUMINATION SYSTEM

(76) Inventors: Bryan T. Warner, 5454 36th Ave., North, St. Petersburg, FL (US) 33710; Matthew W. Thomas, 3529 12th Ave., North, St. Petersburg, FL (US) 33713; Michael J. McCarthy, 3277 Beaver Dr., Clearwater, FL (US) 33761

( * ) Notice: Subject to any disclaimer, the term of this patent is extended or adjusted under 35 U.S.C. 154(b) by 0 days.

(21) Appl. No.: 10/177,095

(22) Filed: Jun. 21, 2002

(51) Int. Cl.[7] ................................................. H05B 5/08
(52) U.S. Cl. ........................ 361/358; 362/249; 315/291
(58) Field of Search .................. 315/219, 224, 315/291, 307; 361/358, 359; 362/145, 249, 20, 812

(56) References Cited

U.S. PATENT DOCUMENTS

| | | | | |
|---|---|---|---|---|
| 4,149,217 A | * | 4/1979 | Tucker | 361/358 |
| 5,015,918 A | * | 5/1991 | Copeland | 315/76 |
| 5,526,236 A | * | 6/1996 | Burnes et al. | 362/20 |
| 5,892,192 A | * | 4/1999 | Ishiguro et al. | 200/5 R |
| 6,183,104 B1 | * | 2/2001 | Ferrara | 362/145 |
| 6,431,728 B1 | * | 8/2002 | Fredericks et al. | 362/249 |

* cited by examiner

*Primary Examiner*—Don Wong
*Assistant Examiner*—Jimmy T. Vu
(74) *Attorney, Agent, or Firm*—Edward P. Dutkiewicz

(57) ABSTRACT

A light emitting diode illumination system comprises a printed circuit board with score lines allowing a user to break the board into segments. The segments are a plurality of printed circuit boards provided with electrical elements. The electrical elements include light emitting diodes, a plurality of resistors and a zener diode. The zener diode has an associated capacitor and a plurality of associated rectifying diodes. The rectifying diodes convert AC to DC. Two pairs of electrical contacts are provided. Either pair is capable of coupling the electrical elements to a source of electrical potential to illuminate the light emitting diodes with minimum current while generating minimum heat.

4 Claims, 4 Drawing Sheets

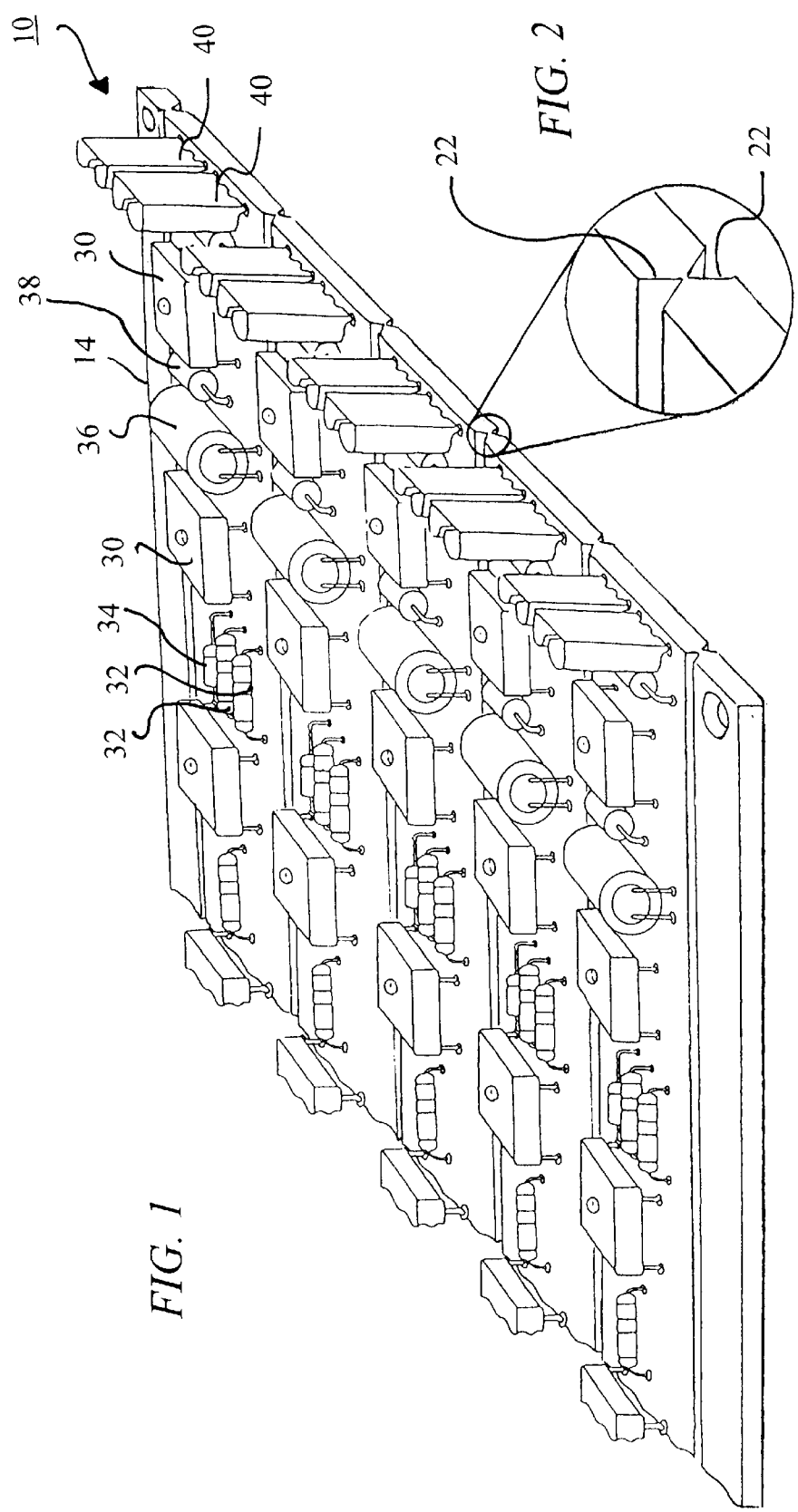

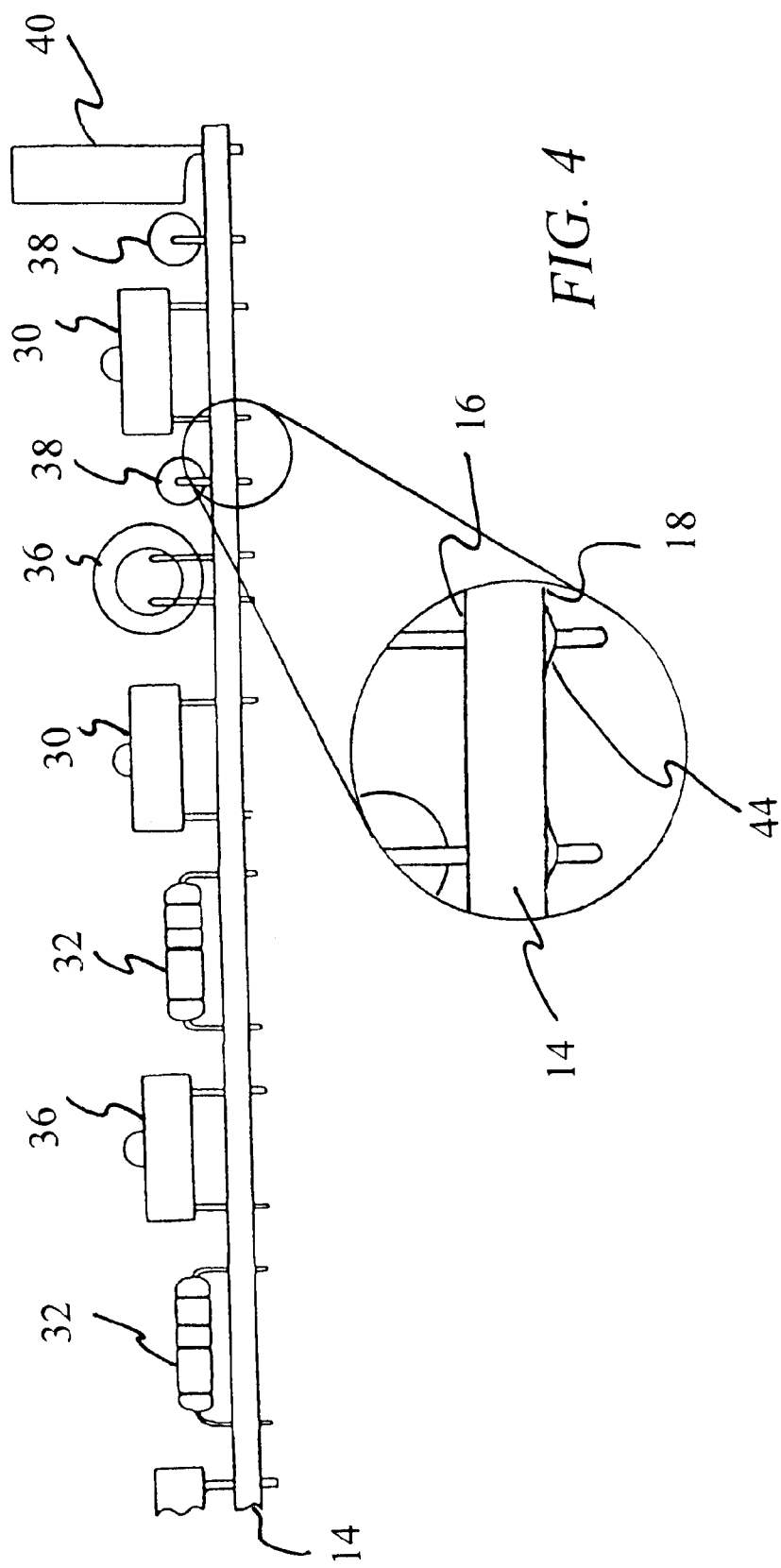

LIGHT EMITTING DIODE ILLUMINATION SYSTEM

BACKGROUND OF THE INVENTION

1. Field of the Invention

The present invention relates to a light emitting diode illumination system and more particularly pertains to the economic and convenient fabrication of variable length illumination segments separable from a common printed circuit board.

2. Description of the Prior Art

The use of illumination systems of known designs and configurations is known in the prior art. More specifically, illumination systems of known designs and configurations previously devised and utilized for the purpose of fabricating light sources through conventional methods and apparatuses are, known to consist basically of familiar, expected, and obvious structural configurations, notwithstanding the myriad of designs encompassed by the crowded prior art which has been developed for the fulfillment of countless objectives and requirements.

By way of example, U.S. Pat. No. 6,394,626 to McColloch discloses a flexible light track for signage. U.S. Pat. No. 6,371,637 to Atchinson et al. discloses a compact, flexible LED array. U.S. Pat. No. 6,283,612 to Hunter discloses a light emitting diode light strip. U.S. Pat. No. 6,167,648 to Dimmick discloses an illuminated modular sign having adjustable quick release modules. U.S. Pat. No. 5,931,577 to Ishibashi discloses a display device and method for making the same. U.S. Pat. No. 5,924,785 to Zhang et al. discloses a light source arrangement. U.S. Pat. No. 6,346,777 to Kim discloses an LED lamp apparatus. Lastly, U.S. Pat. No. 6,072,280 to Allen discloses an LED light string employing series-parallel block coupling.

While these devices fulfill their respective, particular objectives and requirements, the aforementioned patents do not describe a light emitting diode illumination system that allows the economic and convenient fabrication of variable length illumination segments separable from a common printed circuit board.

In this respect, the light emitting diode illumination system according to the present invention substantially departs from the conventional concepts and designs of the prior art, and in doing so provides an apparatus primarily developed for the purpose of the economic and convenient fabrication of variable length illumination segments separable from a common printed circuit board.

Therefore, it can be appreciated that there exists a continuing need for a new and improved light emitting diode illumination system which can be used for the economic and convenient fabrication of variable length illumination segments separable from a common printed circuit board. In this regard, the present invention substantially fulfills this need.

SUMMARY OF THE INVENTION

In view of the foregoing disadvantages inherent in the known types of illumination systems of known designs and configurations now present in the prior art, the present invention provides an improved light emitting diode illumination system. As such, the general purpose of the present invention, which will be described subsequently in greater detail, is to provide a new and improved light emitting diode illumination system and method which has all the advantages of the prior art and none of the disadvantages.

To attain this, the present invention essentially comprises a printed circuit board. The printed circuit board is in a rectangular configuration. The printed circuit board has front and back faces. The printed circuit board also has longitudinal score lines. The lines are equally spaced and have opposing V-shaped cross sections and variable spaced lateral score lines with opposing V-shaped cross sections. The lines allow the board to be broken into segments by a user to fit a particular application. Provided next are short printed circuit board segments. The short printed circuit board segments have electrical elements coupled to the front face. The electrical elements include two light emitting diodes, a plurality of resistors and a zener diode. The zener diode has an associated capacitor and a plurality of associated rectifying diodes. The rectifying diodes convert AC to DC. Two pairs of electrical contacts are provided. Either pair is capable of coupling the electrical elements to a source of electrical potential. Electrical leads are further provided on the back face. The leads couple the electrical elements. In this manner the light emitting diodes are illuminated with minimum current while generating minimum heat.

Further provided are intermediate short printed circuit board segments. The intermediate short printed circuit board segments have electrical elements coupled to the front face. The electrical elements include four light emitting diodes, a plurality of resistors and a zener diode. The zener diode has an associated capacitor and a plurality of rectifying diodes. The rectifying diodes convert AC to DC. Two pairs of electrical contacts are provided. Either pair is capable of coupling the electrical elements to a source of electrical potential. Electrical leads are provided on the back face. The leads couple the electrical elements. In this manner the light emitting diodes are illuminated with minimum current while generating minimum heat. Provided last are long printed circuit board segments. The long printed circuit board segments have elements coupled to the front face. The electrical elements include six light emitting diodes, a plurality of resistors and a zener diode. The zener diode has an associated capacitor and a plurality of rectifying diodes. The rectifying diodes convert AC to DC. Two pairs of electrical contacts are provided. Either pair is capable of coupling the electrical elements to a source of electrical potential. Electrical leads are provided on the back face. The leads couple the electrical elements. In this manner the light emitting diodes are illuminated with minimum current while generating minimum heat.

There has thus been outlined, rather broadly, the more important features of the invention in order that the detailed description thereof that follows may be better understood and in order that the present contribution to the art may be better appreciated. There are, of course, additional features of the invention that will be described hereinafter and which will form the subject matter of the claims attached.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of descriptions and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

It is therefore an object of the present invention to provide a new and improved light emitting diode illumination system which has all of the advantages of the prior art illumination systems of known designs and configurations and none of the disadvantages.

It is another object of the present invention to provide a new and improved light emitting diode illumination system which may be easily and efficiently manufactured and marketed.

It is further an object of the present invention to provide a new and improved light emitting diode illumination system which is of durable and reliable constructions.

An even further object of the present invention is to provide a new and improved light emitting diode illumination system which is susceptible of a low cost of manufacture with regard to both materials and labor, and which accordingly is then susceptible of low prices of sale to the consuming public, thereby making such light emitting diode illumination system economically available to the buying public.

Even still another object of the present invention is to provide a light emitting diode illumination system for the economic and convenient fabrication of variable length illumination segments separable from a common printed circuit board.

Lastly, it is an object of the present invention to provide a new and improved light emitting diode illumination system comprising a printed circuit board. The printed circuit board has score lines allowing the board to be broken into a plurality of printed circuit board segments by a user. The plurality of printed circuit board segments are provided with electrical elements. The electrical elements include light emitting diodes, a plurality of resistors and a zener diode. The zener diode has an associated capacitor and a plurality of rectifying diodes. The rectifying diodes convert AC to DC. Two pairs of electrical contacts are provided. Either pair is capable of coupling the electrical elements to a source of electrical potential to illuminate the light emitting diodes with minimum current while generating minimum heat.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 1 is an enlarged perspective illustration of a light emitting diode illumination system constructed in accordance with the principles of the present invention.

FIG. 2 is an enlarged perspective illustration of the coupling between system segments taken at the circle of FIG. 1.

FIG. 3 is a side elevational view of a portion of one of the segments shown in FIG. 1.

FIG. 4 is an enlarged illustration taken at circle 4 of FIG. 3.

The same reference numerals refer to the same parts throughout the various Figures.

DESCRIPTION OF THE PREFERRED EMBODIMENT

Figure 5:
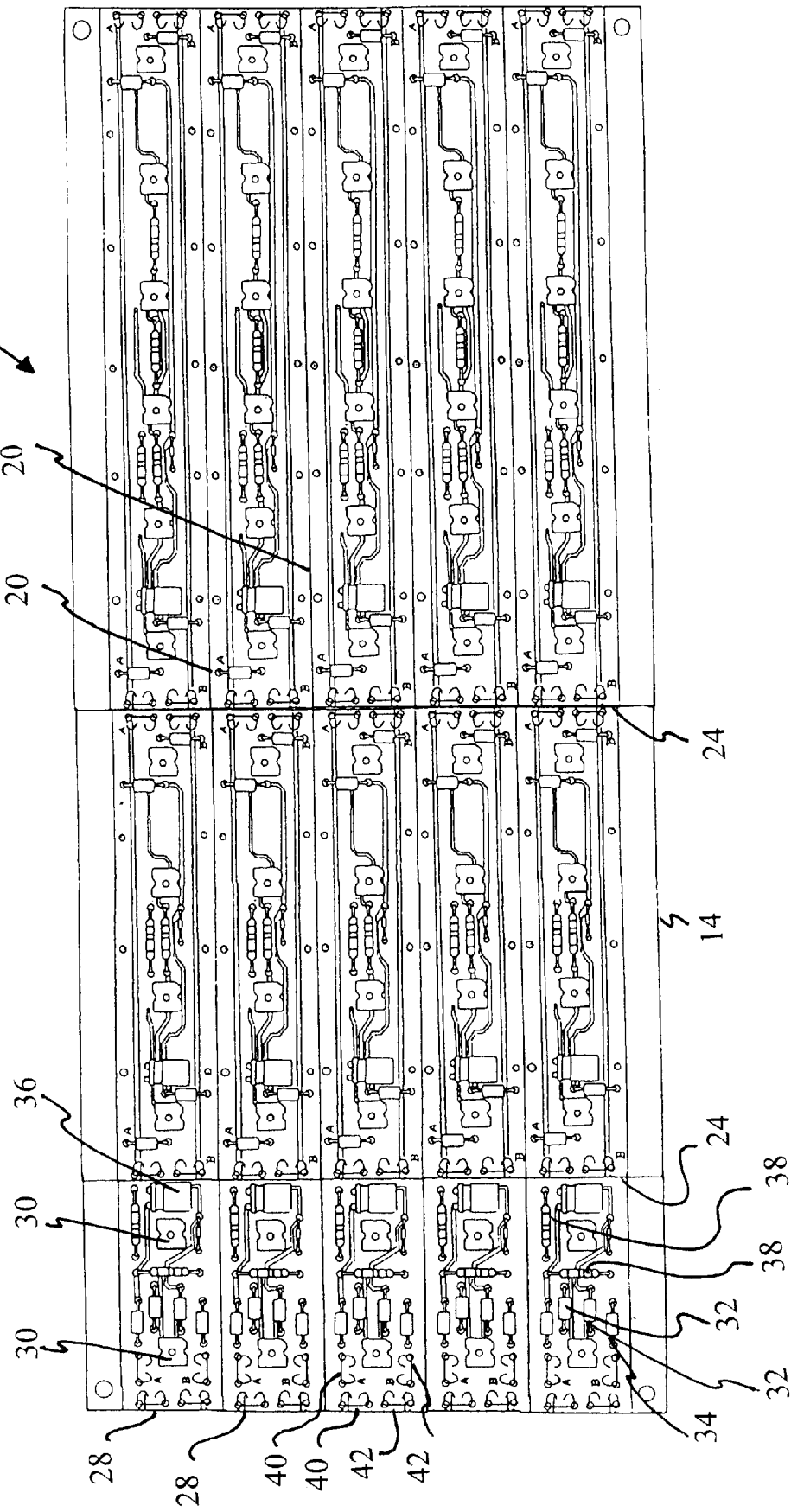
FIG. 5 is a front elevational view of the entire light emitting diode illumination system constructed in accordance with the principles of the present invention and illustrating the primary embodiment of the invention.

With reference now to the drawings, and in particular to FIG. 1 thereof, the preferred embodiment of the new and improved light emitting diode illumination system embodying the principles and concepts of the present invention and generally designated by the reference numeral 10 will be described.

The present invention, the light emitting diode illumination system 10 is comprised of a plurality of components. Such components in their broadest context include a printed circuit board and a plurality of printed circuit board segments. Such components are individually configured and correlated with respect to each other so as to attain the desired objective.

First provided is a printed circuit board 14. The printed circuit board is in a rectangular configuration. The printed circuit board has front and back faces 16, 18. The printed circuit board also has equally spaced longitudinal score lines 20 and variable spaced lateral score lines 24. The lines have opposing V-shaped cross sections 22 allowing the board to be broken into segments by a user to fit a particular application.

Provided next are short printed circuit board segments 28. The short printed circuit board segments have electrical elements coupled to the front face. The electrical elements include two light emitting diodes 30, a plurality of resistors 32 and a zener diode 34. The zener diode has an associated capacitor 36 and a plurality of associated rectifying diodes 38. The rectifying diodes convert AC to DC. Two pairs of electrical contacts 40, 42 are provided. Either pair is capable of coupling the electrical elements to a source of electrical potential. Electrical leads 44 are further provided on the back face. The leads couple the electrical elements. In this manner the light emitting diodes are illuminated with minimum current while generating minimum heat.

Further provided are intermediate short printed circuit board segments 48. The intermediate short printed circuit board segments have electrical elements coupled to the front face. The electrical elements include four light emitting diodes 30, a plurality of resistors 32 and a zener diode 34. The zener diode has an associated capacitor 36 and a plurality of rectifying diodes 38. The rectifying diodes convert AC to DC. Two pairs of electrical contacts 40, 42 are provided. Either pair is capable of coupling the electrical elements to a source of electrical potential. Electrical leads 44 are provided on the back face. The leads couple the electrical elements. In this manner the light emitting diodes are illuminated with minimum current while generating minimum heat. This allows for economic operation and permits usage in environments where heat is detrimental as, for example, in refrigerators and freezers.

Provided last are long printed circuit board segments 52. The long printed circuit board segments have elements coupled to the front face. The electrical elements include six light emitting diodes 30, a plurality of resistors 32 and a zener diode 34. The zener diode has an associated capacitor 36 and a plurality of rectifying diodes 38. The zener diodes convert AC to DC. Two pairs of electrical contacts 40, 42 are provided. Either pair is capable of coupling the electrical elements to a source of electrical potential. As such, power may be applied to segments from either end. Electrical leads 44 are provided on the back face. The leads couple the electrical elements. In this manner the light emitting diodes are illuminated with minimum current while generating minimum heat.

Figure 6:
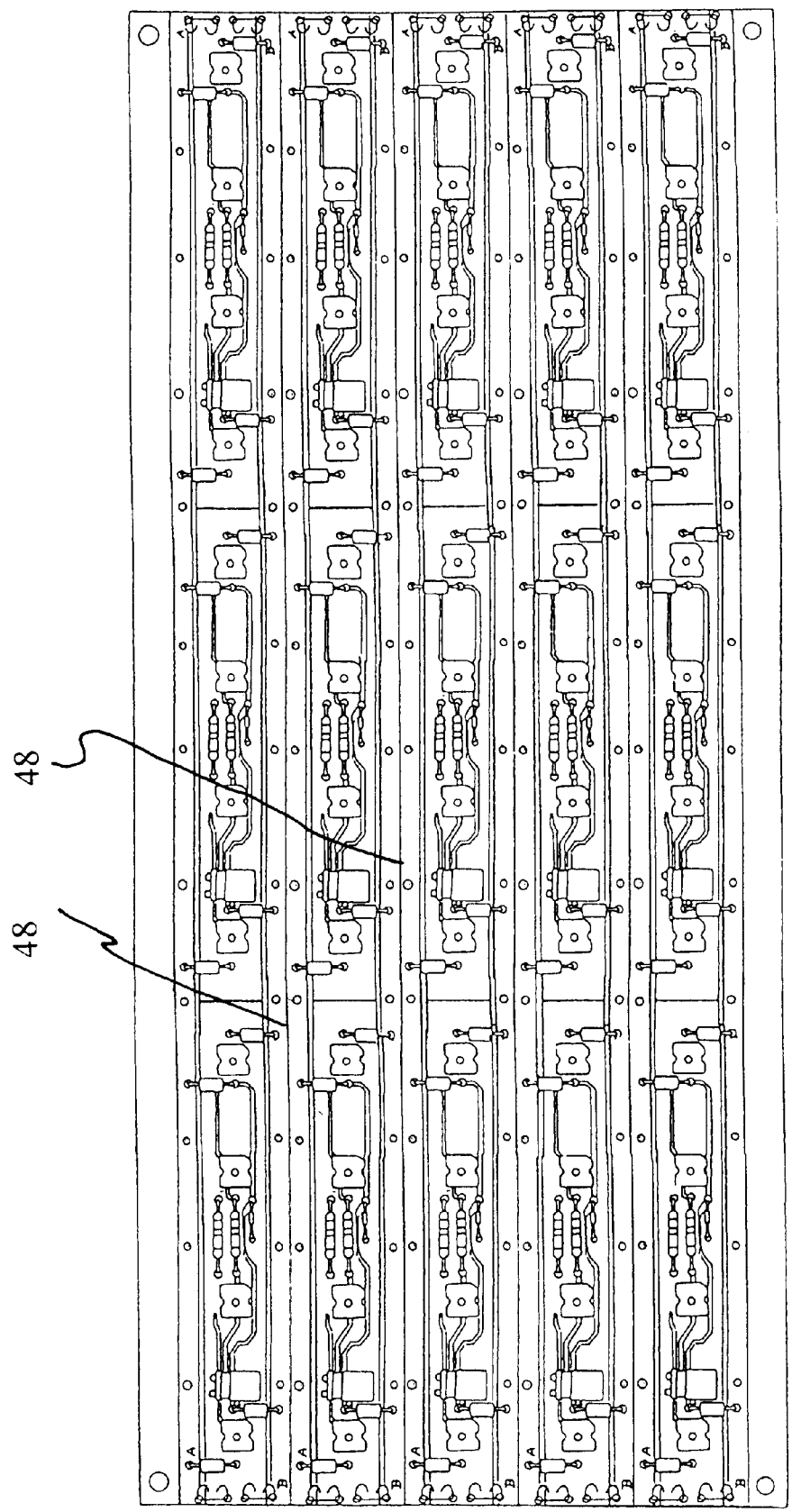
FIG. 6 is a front elevational view similar to FIG. 5 but illustrating an alternate embodiment of the invention.

As shown in FIG. 6, the present invention may be utilized without the variably spaced lateral score lines of the primary embodiment whereby each segment is of an extended length equal to the length of the printed circuit board. In this embodiment, the score lines are equally spaced longitudinal score lines 48.

Recent improvements in the growth and manufacture of the crystals utilized in the production of the LEDs has permitted greater utility and flexibility for its use as an alternative to standard sign industry lighting sources such as neon, fluorescent, cold cathode, metal halide, incandescent and high pressure sodium light sources. LEDs offer a low voltage alternative to the standard or high voltage lighting sources mentioned. Further developments in LEDs Technology have permitted a greater ability to modulate the intensity and light output expanding the potential applications for LEDs lighting technology. Various industries, including the sign industry have maximized this benefit to produce new and useful and unobvious illumination patterns and techniques.

Various corporations have introduced the improved LEDs utilizing different and varying approaches to achieving similar lighting applications in the signage industry. LED lighting systems are strung together in different and varying configurations. Further advancements have been made and LEDs technology has been accepted in mainstream use as a superior lighting alternative as evidenced by street signal lighting, changing traffic signals, beginning to convert to the specific use of array LEDs as the preferred lighting for its intensity, visibility and clarity.

The invention is a low profile lighting system utilizing a printed circuit board with surface mounted electrical components required to produce light through the plurality of light emitting diodes (LEDs). The present invention relates to improvements in LED's and advancements in design specification, printed circuit board layouts and electrical component configurations. The invention, through its specific design, most efficiently utilizes the minimum amount of low voltage electricity, to maximize lighting intensity across the standard lighting spectrum (i.e., red range, amber, blue, white, and green. The design of the printed circuit board, referencing specific electrical component configurations and anticipated flow of electrical current, when segmented units are utilized singularly or in plurality, minimizes "voltage resistance drop" across a segmented unit or a group in parallel, calculated in Ohms.

The printed circuit board utilizes longitudinal and lateral opposing v-groove score lines to maximize production efficiencies, by way that, the invention can be broken along the score lines to desired lengths to maximize the utility of the invention and speed of production. Each manufactured printed circuit board is comprised of segmented and complete lighting units, in standard varying lengths of 2", 4", 6" and 12". These varying sized, standard lengths can be combined through specific electrical connection components to achieve desired configurations. The design of the invention allows significantly increased tolerances for electrical component configuration. The present invention has been configured to reduce operating temperature of the LED's light sources while maximizing the dissipation of ambient heat of the printed circuit board created during its operation. This consideration further expands the range of applications this invention can be utilized in such as refrigeration environments where earlier forms of LEDs lighting systems maximized heat output, without consideration, to the detriment of the system component and/or the environment in which it is utilized.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by LETTERS PATENT of the United States is as follows:

1. A light emitting diode illumination system including the economic and convenient fabrication of variable length illumination segments separable from a common printed circuit board comprising, in combination:

a printed circuit board in a rectangular configuration having a front face and a back face and equally spaced longitudinal score lines with opposing V-shaped cross sections to allow the board to be broken into segments by a user to fit a particular application and variably spaced lateral score lines with opposing V-shaped cross sections to allow the board to be broken into segments by a user to fit a particular application;

short printed circuit board segments with electrical elements coupled to the front face, the electrical elements including two light emitting diodes and a plurality of resistors and a zener diode 34 with an associated capacitor and a plurality of associated rectifying diode for converting AC to DC and two pair of electrical contacts either pair capable of coupling the electrical elements to a source of electrical potential and electrical leads on the back face coupling the electrical elements to illuminate the light emitting diodes with minimum current while generating minimum heat;

intermediate short printed circuit board segments with electrical elements coupled to the front face, the electrical elements including four light emitting diodes and a plurality of resistors and a zener diode with an associated capacitor and a plurality of rectifying diodes for converting AC to DC and two pair of electrical contacts either pair capable of coupling the electrical elements to a source of electrical potential and electrical leads on the back face coupling the electrical elements to illuminate the light emitting diodes with minimum current while generating minimum heat; and long printed circuit board segments with electrical elements coupled to the front face, the electrical elements including six light emitting diodes and a plurality of resistors and a zener diode with an associated capacitor and a plurality of rectifying diodes for converting AC to DC and two pair of electrical contacts either pair capable of coupling the electrical elements to a source of electrical potential and electrical leads on the back face coupling the electrical elements to illuminate the light emitting diodes with minimum current while generating minimum heat.

2. A light emitting diode illumination system comprising:

a printed circuit board having score lines allowing the board to be broken into segments by a user; and a plurality of printed circuit board segments with electrical elements, the board including light emitting diodes and a plurality of resistors and a zener diode with an associated capacitor and a plurality of associated rectifying diodes for converting AC to DC and two pair of electrical contacts either pair capable of coupling the electrical elements to a source of electrical potential to illuminate the light emitting diodes with minimum current while generating minimum heat, each of the printed circuit boards is in rectangular configuration having a front face and a back face and the score lines are equally spaced longitudinal score lines with opposing V-shaped cross sections.

3. A light emitting diode illumination system comprising:

a printed circuit board having score lines allowing the board to be broken into segments by a user; and a circuit board having a plurality of printed circuit board segments, each of the circuit boards having a rectangular configuration with each having a front face and a back face and the score lines are equally spaced longitudinal score lines with opposing V-shaped cross sections with electrical elements including light emitting diodes and electrical contacts.

4. A light emitting diode illumination system comprising:

a printed circuit board having at least one printed circuit board segment with electrical elements including at least one light emitting diode and at least one resistor and at least one zener diode with an associated capacitor and at least one associated rectifying diode for converting AC to DC and two pair of electrical contacts either pair capable of coupling the electrical elements to a source of electrical potential to illuminate the light emitting diodes with minimum current while generating minimum heat, with the circuit board having a front face and a back face and the score lines are equally spaced longitudinal score lines with opposing V-shaped cross sections.

* * * * *